United States Patent
Moon et al.

(10) Patent No.: US 9,528,168 B2
(45) Date of Patent: Dec. 27, 2016

(54) NANO WIRE AND METHOD FOR MANUFACTURING THE SAME

(75) Inventors: Jong Woon Moon, Seoul (KR); Woo Ju Jeong, Seoul (KR); Joon Rak Choi, Seoul (KR); Soung Kyu Park, Seoul (KR); Won Jong Choi, Seoul (KR); Sang Hoon Lee, Seoul (KR); Yong Sang Lee, Seoul (KR); Hyeok Soo Seo, Seoul (KR)

(73) Assignees: LG INNOTEK CO., LTD., Seoul (KR); NANOPYXIS CO., LTD., Jeonju, Jeollabuk-Do (KR)

( * ) Notice: Subject to any disclaimer, the term of this patent is extended or adjusted under 35 U.S.C. 154(b) by 313 days.

(21) Appl. No.: 13/994,617

(22) PCT Filed: Dec. 14, 2011

(86) PCT No.: PCT/KR2011/009622
§ 371 (c)(1),
(2), (4) Date: Nov. 12, 2013

(87) PCT Pub. No.: WO2012/081904
PCT Pub. Date: Jun. 21, 2012

(65) Prior Publication Data
US 2014/0054516 A1   Feb. 27, 2014

(30) Foreign Application Priority Data

Dec. 14, 2010  (KR) .................. 10-2010-0127930
Dec. 14, 2010  (KR) .................. 10-2010-0127931

(51) Int. Cl.
*H01B 1/02*   (2006.01)
*C22B 3/00*   (2006.01)
(Continued)

(52) U.S. Cl.
CPC ............ *C22B 11/04* (2013.01); *B22F 1/0025* (2013.01); *B22F 9/24* (2013.01); *B82Y 30/00* (2013.01);
(Continued)

(58) Field of Classification Search
CPC ...................................................... H01B 1/02
(Continued)

(56) References Cited

U.S. PATENT DOCUMENTS

2007/0056402 A1   3/2007  Cho et al.
2008/0210052 A1   9/2008  Allemand
(Continued)

FOREIGN PATENT DOCUMENTS

JP   2008-179836 A   8/2008
JP   2008-190006 A   8/2008
(Continued)

OTHER PUBLICATIONS

Kim, T.Y. et al. "Ionic-Liquid-Assisted Formation of Silver Nanowires" *Angewandte Chemie Int. Ed.*, 2009, 48:3806-3809.
(Continued)

*Primary Examiner* — Mark Kopec
*Assistant Examiner* — William Young
(74) *Attorney, Agent, or Firm* — Saliwanchik, Lloyd & Eisenschenk

(57) ABSTRACT

A method for manufacturing a nanowire is provided. A solvent is heated. A catalyst is added to the solvent. A metal compound is added to the solvent to form a metal nanowire. The metal nanowire is refined. In the refining of the metal nanowire, the catalyst and a refinement material to converting an insoluble material generated by the catalyst into a soluble material may be added to the solvent. The catalyst
(Continued)

may include NaCl and at least one selected from the group consisting of Mg, K, Zn, Fe, se, Mn, P, Br and I.

12 Claims, 3 Drawing Sheets

(51) Int. Cl.
- *B22F 1/00* (2006.01)
- *B22F 9/24* (2006.01)
- *B82Y 30/00* (2011.01)
- *B82Y 40/00* (2011.01)

(52) U.S. Cl.
CPC ............. *B82Y 40/00* (2013.01); *H01B 1/02* (2013.01); *H01L 2221/1094* (2013.01)

(58) Field of Classification Search
USPC ........................................................ 252/514
See application file for complete search history.

(56) References Cited

U.S. PATENT DOCUMENTS

| | | | |
|---|---|---|---|
| 2009/0098405 A1 | 4/2009 | Matsunami | |
| 2009/0196788 A1* | 8/2009 | Wang et al. | 420/501 |
| 2009/0226753 A1 | 9/2009 | Naoi | |
| 2009/0233086 A1 | 9/2009 | Hirai | |
| 2009/0242231 A1 | 10/2009 | Miyagisima et al. | |
| 2010/0148132 A1* | 6/2010 | Jiang | B82Y 30/00 252/514 |
| 2010/0307792 A1 | 12/2010 | Allemand et al. | |
| 2011/0024159 A1* | 2/2011 | Allemand et al. | 174/126.1 |

FOREIGN PATENT DOCUMENTS

| | | |
|---|---|---|
| JP | 2009-108407 A | 5/2009 |
| JP | 2009-203484 A | 9/2009 |
| JP | 2009-215573 A | 9/2009 |
| JP | 2009-215594 A | 9/2009 |
| JP | 2009-242880 A | 10/2009 |
| KR | 10-2007-0031060 A | 3/2007 |
| KR | 10-2008-0021334 A | 3/2008 |
| WO | WO-2009/107694 A1 | 9/2009 |
| WO | WO-2010/129604 A1 | 11/2010 |

OTHER PUBLICATIONS

Zhang, W.C. et al. "Self-organized formation of silver nanowires, nanocubes and bipyramids via a solvothermal method" *Acta Materialia*, 2008, 56:2508-2513.

International Search Report in International Application No. PCT/KR2011/009622, filed Dec. 14, 2011.

Office Action dated Jan. 15, 2013 in Korean Application No. 10-2010-0127930, filed Dec. 14, 2010.

Kwon, J. et al. "A study on detecting amine gas using chemical characterization of Ag nanowire" *Nanotechnology*, 2010 10th IEEE Conference, Piscataway, NJ., pp. 753-757.

European Search Report in European Application No. 11848327, dated Jun. 11, 2014.

Office Action dated Jun. 17, 2014 in Japanese Application No. 2013-544393.

* cited by examiner

NANO WIRE AND METHOD FOR MANUFACTURING THE SAME

CROSS-REFERENCE TO RELATED APPLICATIONS

This application is the U.S. national stage application of International Patent Application No. PCT/KR2011/009622, filed Dec. 14, 2011, which claims priority to Korean Application Nos. 10-2010-0127930, filed Dec. 14, 2010, and 10-2010-0127931, filed Dec. 14, 2010, the disclosures of each of which are incorporated herein by reference in their entirety.

TECHNICAL FIELD

The present disclosure relates to a nanowire and method for manufacturing the same.

BACKGROUND ART

A transparent electrode is applied to various electronic products such as a display device, a solar cell, a mobile device, etc. Research on a nanowire which is a wire-shaped structure with the diameter of the order of a nanometer as a conductive material for forming such a transparent electrode is being actively performed.

Since nanowires have a superior electrical conductivity, flexibility and transmittance, they allow transparent electrodes to have superior characteristics. However, since it is difficult to control forming of nanowires, spherical, plate-shaped, or polyhedral nano particles, nano rods having a low aspect ratio, etc. may be generated during a reaction, so that production yield may be reduced. Also, since nanowires agglomerate easily to form nano clusters, it is not easy to manufacture nanowires. In the case where a catalyst used for accelerating a nanowire formation reaction is an insoluble material, refinement is not easy, and a centrifugal separation for removing the catalyst makes it difficult to mass-produce nanowires, so that production yield is reduced.

DISCLOSURE OF INVENTION

Technical Problem

Embodiments provide a nanowire that can enhance productivity and characteristics, and a method for manufacturing the same.

Solution to Problem

In one embodiment, a method for manufacturing a nanowire comprises: heating a solvent; adding a catalyst to the solvent; adding a metal compound to the solvent to form a metal nanowire; and refining the metal nanowire, wherein in the refining of the metal nanowire, a refining material to convert an insoluble material generated by the catalyst into a soluble material may be added to the solvent.

In another embodiment, a method of manufacturing a nanowire comprises: heating a solvent; adding a catalyst to the solvent; adding a metal compound to the solvent to form a metal nanowire; and refining the metal nanowire, wherein the catalyst may include NaCl and at least one selected from the group consisting of Mg, K, Zn, Fe, se, Mn, P, Br and I.

Advantageous Effects of Invention

In the method for manufacturing a nanowire according to the present invention, by adding a material capable of converting insoluble material into soluble material in the refining of nanowire, additive can be easily removed from metal nanowire. Since the method according to the present invention does not need to perform a separate centrifugation or the like, the method is suitable for mass production and production yield is also superior.

Also, in the method for manufacturing a nanowire according to the present invention, by using bay salt or refined salt as catalyst, corrosion and surface oxidation of metal nanowire can be prevented, electrical conductivity can be enhanced, and production cost can be saved.

Various metals or halogen elements such as Na, Mg, K, Br, and the like contained in bay salt or refined salt allow metal nanowires to be formed in a long shape (e.g., 20 μm or more), which is advantageous in forming a network. By doing so, electrical conductivity, flexibility and transmittance of a film manufactured by using metal nanowires can be enhanced. Thus, since metal nanowire can be smoothly formed by bay salt or refined salt, the amount of capping agent can be reduced and thus the electrical conductivity can be prevented from being reduced by the remaining capping agent.

At this time, by using bay salt which is greater in amount of various metals or halogen element than refined salt, the effects can be further enhanced.

Meanwhile, in the method for manufacturing nanowire according to the present invention, by using catalyst having a superior reducing force, reaction temperature can be reduced and thus agglomeration phenomenon can be minimized. Resultantly, production yield of metal nanowire can be enhanced to 80% or more.

BEST MODE FOR CARRYING OUT THE INVENTION

Reference will now be made in detail to the embodiments of the present disclosure, examples of which are illustrated in the accompanying drawings.

Figure 1:
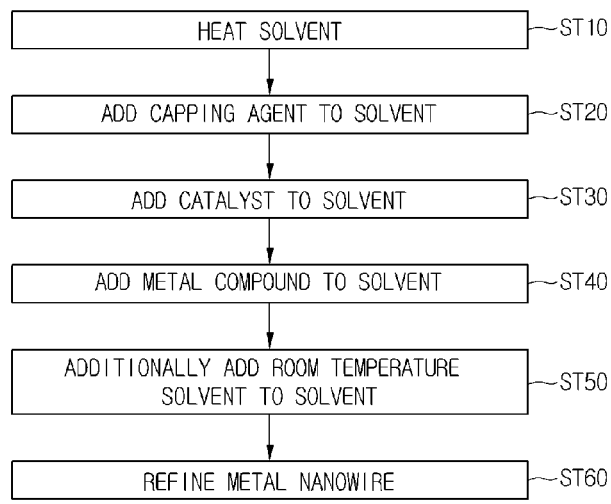
FIG. 1 is a flow diagram showing a method for manufacturing a nanowire according to an embodiment.

FIG. 1 is a flow diagram showing a method for manufacturing a nanowire according to an embodiment.

Hereinafter, a method for manufacturing a nanowire according to Embodiment 1 will be described with reference to FIG. 1.

Referring to FIG. 1, a method for manufacturing a nanowire according to Embodiment 1 includes forming (ST10-ST50) a metal nanowire, and refining (ST60) the metal nanowire. Herein, the forming (ST10-ST50) of the metal nanowire may include heating (ST10) a solvent, adding (ST20) a capping agent to the solvent, adding (ST30) a catalyst to the solvent, adding (ST40) a metal compound to the solvent, and additionally adding (ST50) a room temperature solvent to the solvent.

These steps are not essential but some of these steps may be not performed and sequence of these steps may be changed according to a manufacturing method. Each of the foregoing steps will now be described in more detail.

In the heating (ST10) of the solvent, the solvent is heated to a reaction temperature suitable for forming a metal nanowire.

A reducing solvent may be used as the solvent. This reducing solvent may function as a mile reducing agent as well as a solvent mixing other materials to help forming of a metal nanowire. Examples of the reducing solvent may include ethylene glycol (EG), propylene glycol (PG), 1,3-propanediole, dipropylene glycol, glycerine, glycerol, glucose, and the like. The reaction temperature may be controlled by various methods in consideration of solvent, type and characteristic of metal compound.

In an example, in the case of forming a silver nanowire using propylene glycol which is superior in reducing force of silver than ethylene glycol, the reaction temperature may be in a range of 80° C. to 140° C. If the reaction temperature is less than 80° C., reaction speed is low and thus reaction may not occur smoothly, so that process time may be lengthened. If the reaction temperature exceeds 140° C., the reaction speed is accelerated and thus crystallizing speed of metal quickens and thereby agglomeration phenomenon occurs, so that a shape suitable for silver nanowire may not be obtained and production yield may be lowered.

Thus, in this embodiment, by using propylene glycol having superior reducing force as a solvent, the silver nanowire may be manufactured at a temperature lower than that in a related art (e.g., when ethylene glycol is used as a reducing solvent, the reaction temperature is 160° C. or more) In the case of related arts, since the reaction temperature is very high, silver nanowires having a short length (e.g., less than 15 μm) which is disadvantageous in forming a network may be formed, and the production yield is also very low. Meanwhile, in this embodiment, by lowering the reaction temperature, silver nanowires having a length of 20 μm or more may be manufactured with a high production yield.

Next, in the adding (ST20) of the capping agent to the solvent, a capping agent for inducing forming of a nanowire is added to the solvent. If reduction for forming a metal nanowire occurs too fast, metal particles agglomerate and thus it becomes difficult to achieve a wire shape. Therefore, the capping agent allows materials in the solvent to be dispersed properly, thereby preventing the materials in the solvent from agglomerating. Also, the capping agent induces the materials in the solvent to strongly bond to surface among crystal surfaces of silver nanowire and to be thus grown to surface.

Various materials may be used for the capping agent. Examples of the capping agent may include polyvinyl pyrrolidone (PVP), cetyltrimethylammonium bromide (CTAB), cetyltrimethylammonium chloride (CTAC), polyvinylalcohol (PVA), polyacrylamide and the like.

Next, in the adding (ST30) of adding a catalyst to the solvent, a catalyst for accelerating a metal nanowire forming reaction is added. Examples of the catalyst may include AgCl, KBr, KI, $CuCl_2$, $PtCl_2$, $H_2PtCl_4$, $H_2PtCl_6$, AuCl, $AuCl_3$, $HAuCl_4$, $HAuCl_2$, and the like. These catalysts may be used alone or by mixing two or more species thereof.

Herein, the catalysts AgCl, $PtCl_2$, AuCl, $AuCl_3$, and the like are materials insoluble in aqueous solution, and AgBr which may be generated by KBr is also an insoluble material. These insoluble materials may be separated by a refining material in the subsequent refining (ST60) of the metal nanowire. The separation of the insoluble materials will be described in more detail in the refining (ST60) of the metal nanowire.

Next, in the adding (ST40) of the metal compound to the solvent, a metal compound is added to the solvent to form a reaction solution.

At this time, the metal compound may be added to the solvent containing capping agent and catalyst after the metal compound is dissolved by a separate solvent. The separate solvent may be the same material as or a different material from the solvent used primarily. The metal compound may be added after catalyst is added and a predetermined time period elapses. This is to stabilize the temperature to a proper reaction temperature.

Herein, the metal compound is a compound containing a metal for forming a metal nanowire intended to manufacture. In the case of forming a silver nanowire, a metal compound such as $AgNO_3$, $KAgCN_2$, or the like may be used.

When the metal compound is added to the solvent to which capping agent and catalyst have been added, a reaction occurs to start forming of a metal nanowire.

In this embodiment, the capping agent may be added by 50-30 parts by weight with respect to 100 parts by weight of a metal compound such as $AgNO_3$ or $KAgCN_2$. In the case where the capping agent is added less than 50 parts by weight, agglomeration phenomenon cannot be prevented sufficiently. In the case where the capping agent is added in excess of 300 parts by weight, metal nano particles may be generated or the capping agent may be left in the manufactured metal nanowire to thus reduce the electrical conductivity.

The catalyst may be added by 2 parts by weight to 30 parts by weight with respect to 100 parts by weight of the metal compound. If the catalyst is added less than 2 parts by weight, the reaction cannot be accelerated sufficiently, and if the catalyst is added in excess of 30 parts by weight, the catalyst may be left in the manufactured metal nanowire to thus reduce the electrical conductivity.

Next, in the additional adding (ST50) of the room temperature solvent to the reaction solution, a room temperature solvent is additionally added to the solvent starting the reaction. The room temperature solvent may be the same material as or a different material from the solvent used primarily. Polyol such as ethylene glycol, propylene glycol or the like may be used as an example of the room temperature.

By continuously heating the solvent starting the reaction so as to maintain a reaction temperature, the temperature of the solvent may be raised. Therefore, as described above, by adding the room temperature solvent to the solvent starting the reaction to temporarily reduce the temperature of the solvent, it is possible to constantly maintain the reaction temperature.

The additional adding (ST50) of the room temperature solvent may be performed one time or several times in consideration of the reaction time, the temperature of the reaction solution and the like. Also, since the additional adding (ST50) of the room temperature solvent is not essential, the additional adding (ST50) may be omitted.

The metal nanowire formed as such may have a diameter of 40 nm to 70 nm and a length of 20 μm or more due to the low reaction temperature.

Next, in the refining (ST60) of the nanowire, the metal nanowire is refined and collected from the reaction solution.

In more detail, by adding acetone, tetrahydrofuran or the like which is more nonpolar than water to the reaction solution, the metal nanowire is precipitated at a lower portion of the reaction solution by the capping agent left on a surface of the metal nanowire. This is why the capping agent is well dispersed in the solution but is not dispersed in acetone or the like but is precipitated. Thereafter, by throwing an upper layer solution away, some of the capping agent and the nano particles are removed.

Distilled water is added to the remaining solution to disperse the metal nanowire, the insoluble catalyst particles, and the metal nano particles, and acetone or the like is additionally added to precipitate the metal nanowire and the insoluble catalyst having a high specific gravity and to disperse the metal nano particles and the insoluble catalyst particles having a low specific gravity. In this embodiment, when the distilled water is added to the remaining solution, a refining material capable of converting the insoluble material generated in the distilled water by the catalyst into a soluble material is dissolved and added together with the distilled water. By doing so, the insoluble catalyst may be easily converted into the soluble material without a separate additional process. Thereafter, by throwing an upper layer solution away, some of the capping agent, the metal nano particles and the foregoing soluble material are removed.

This process is repeatedly performed to collect the metal nanowire, and the collected metal nanowire is stored in the distilled water. By storing the metal nanowire in the distilled water, it can be prevented that the metal nanowires are again agglomerated.

Examples of the refining material may include KCN, NaCN, $HNO_3$, and $NH_4OH$.

With an example of the metal compound of $AgNO_3$, the catalyst of AgCl and KBr and the refining material of KCN, a reason that can convert the catalyst and the insoluble material formed by the catalyst into the soluble material will be described.

KBr used as the catalyst reacts with $AgNO_3$ to generate AgBr. AgCl used as the catalyst, and AgBr generated by the reaction of KBr and $AgNO_3$ are insoluble materials. When KCN is added to the above insoluble materials, respectively, AgCl and KBr react with KCN as the following reaction equations, so that soluble materials such as $KAg(CN)_2$ and KCl are generated.

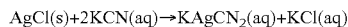
AgCl(s)+2KCN(aq)→$KAgCN_2$(aq)+KCl(aq)

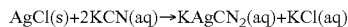
AgCl(s)+2KCN(aq)→$KAgCN_2$(aq)+KCl(aq)

Since the soluble materials such as $KAg(CN)_2$ and KCl are positioned in the upper layer solution, the soluble materials are removed naturally when the upper layer solution is thrown away.

As another example, when $HNO_3$ is used as the refining material, reaction equations are as follows:

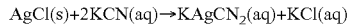
AgCl(s)+2KCN(aq)→$KAgCN_2$(aq)+KCl(aq)

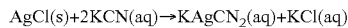
AgCl(s)+2KCN(aq)→$KAgCN_2$(aq)+KCl(aq)

As another example, when $HNO_3$ and $NH_4OH$ are used as the refining material, reaction equations are as follows:

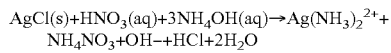
AgCl(s)+$HNO_3$(aq)+$3NH_4OH$(aq)→$Ag(NH_3)_2^{2+}$+
$NH_4NO_3$+OH−+HCl+$2H_2O$

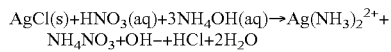
AgCl(s)+$HNO_3$(aq)+$3NH_4OH$(aq)→$Ag(NH_3)_2^{2+}$+
$NH_4NO_3$+OH−+HCl+$2H_2O$ Herein, the refining material may be contained by 1.5 equivalents by weight to 3 equivalents by weight relative to the number of moles of the catalyst. If the refining material is contained less than 1.5 equivalents by weight, insoluble AgCl and AgBr particles exist and thus the surface of the metal nanowire may be oxidized. If the refining material is contained in excess of 3 equivalents by weight, concentration of CN— or the like in the solution is increased and thus the metal nanowire may be oxidized during the refining operation. Therefore, the amount of the refining material is limited to the foregoing equivalent weigh range that can convert the catalyst existing in the reaction solution into a soluble material relative to the number of moles of the catalyst existing in the reaction solution.

In the method for manufacturing a nanowire according to this embodiment, by adding a material capable of converting the insoluble catalyst into a soluble material in the refining of the nanowire, the catalyst can be easily removed from the metal nanowire. Since the method according to this embodiment does not need to perform a separate centrifugation or the like, the method is suitable for mass production and production yield is also superior.

Also, in this embodiment, by lowering the reaction temperature through use of a solvent having a strong reducing force and thus minimizing agglomeration phenomenon, production yield of the metal nanowire can be enhanced. As an example, 80% or more production yield can be obtained.

MODE FOR THE INVENTION

Hereinafter, the present invention will be described in more detail through embodiments. However, the embodiments are used only for illustration of the present invention, and the present invention is not limited to the embodiments.

Embodiment 1

400 ml propylene glycol was heated to 126° C., 12 g polyvinyl pyrrolidone was added and dissolved, and then 0.2 g KBr and 1.0 g AgCl are added as a catalyst. After 1 hour and 30 minutes, 4.6 g $AgNO_3$ was dissolved in 100 ml propylene glycol to obtain an $AgNO_3$ solution and then the $AgNO_3$ solution was added to a mixing solution of polyvinyl pyrrolidone, KBr, AgCl and a solvent. After about 30 minutes, silver nanowire started to be generated, and then reaction continued for about 1 hour to complete the formation of silver nanowire.

1600 ml acetone was added to the reaction-completed solution and then an upper layer solution in which propylene glycol, silver nano particles and polyvinyl pyrrolidone were dispersed was thrown away.

100 ml distilled water containing 0.908 g KCN dissolved was added to disperse the agglomerated silver nanowires and silver nano particles. 400 ml acetone was added and then an upper layer solution in which propylene glycol, silver nano particles, polyvinyl pyrrolidone, $KAg(CN)_2$, KCl, and KBr were dispersed was thrown away. After this process was repeated three times, the remaining solution was stored in 30 ml distilled water.

Comparative Example 1

Except that ethylene glycol was heated to 160° C. and distilled water, which does not contain KCN, was used in the refining of a nanowire, a silver nanowire of Comparative example 1 was manufactured in the same process as that of Embodiment 1.

Comparative Example 2

Except that distilled water, which did not contain KCN, was used in the refining of a nanowire, a silver nanowire of comparative example 2 was manufactured in the same process as that of Embodiment 1.

Diameter, length, production yield, purity after refining, transmittance, haze and surface resistance of silver nanowires manufactured according to Embodiment 1, Comparative example 1, and Comparative example 2 are shown in table 1. Photographs of silver nanowires manufactured according to Embodiment 1, Comparative example 1, and Comparative example 2 were taken and shown in FIGS. 2, 3 and 4, respectively.

TABLE 1

|  | Embodiment 1 | Comparative ex. 1 | Comparative ex. 2 |
|---|---|---|---|
| Diameter[nm] | 40~50 | 55~65 | 40~50 |
| Length[μm] | 20 or more | Less than 15 | 20 or more |
| Production yield[%] | 80 or more | Less than 50 | 80 or more |
| Purity after refinement [%] | 99 or more | 95 or less | 95 or less |
| Transmittance[T %] | 87 or more | 85 or less | 87 or more |
| Haze[%] | 2.5 or less | 4.0 or more | 3.2 or less |
| Surface resistance [Ω/□] | 170 or less | 200 or more | 200 or more |

Figure 2:
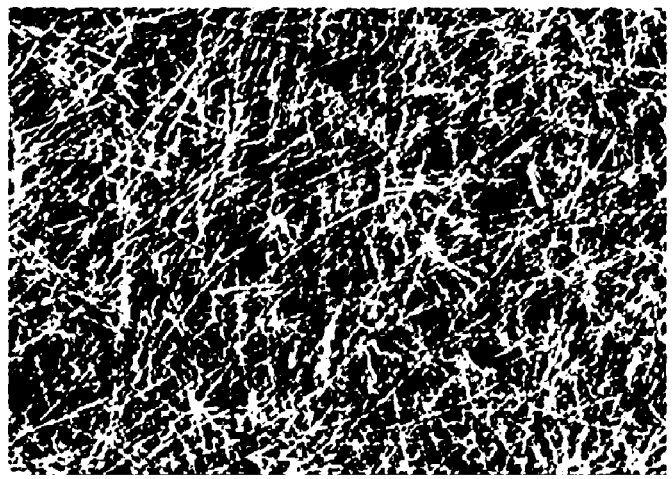
FIG. 2 is a photograph of a silver nanowire manufactured according to embodiment 1.
Figure 3:
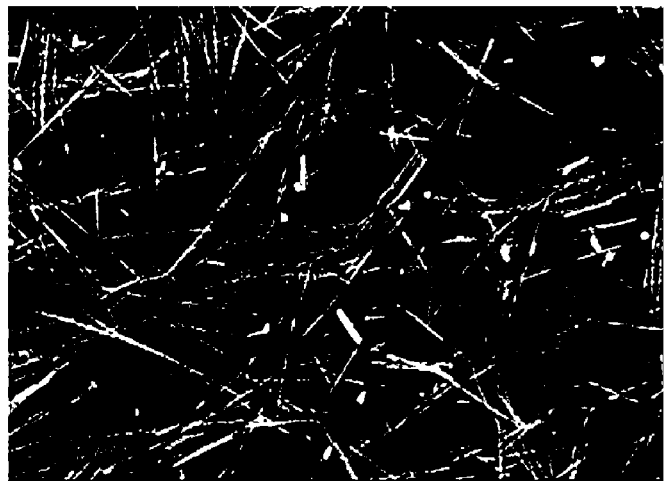
FIG. 3 is a photograph of a silver nanowire manufactured according to Comparative example 1.

Referring to table 1 and FIG. 2, it can be seen that the silver nanowire according to Embodiment 1 has a diameter ranging from 40 nm to 50 nm, a length of 20 μm or more, and a production yield of 80% or more. Also, it can be seen that the insoluble material used as the catalyst does not almost remain in the silver nanowire, a transparent conductive film manufactured of the silver nanowire has superior transmittance, haze and surface resistance. On the other hand, referring to table 1 and FIG. 3, it can be seen that the silver nanowire according to Comparative example 1 has a length of less than 15 μm and a production yield of less than 50%. Compared with the silver nanowire of Comparative example 1 having the high reaction temperature, the silver nanowire of Embodiment 1 is long and may be manufactured with a superior production yield. It is anticipated that this result is due to the low reaction temperature allowing the silver nanowire to be grown sufficiently during the growth of the sliver nanowire. Under ethylene glycol of a high temperature of 160° C., abrupt growth occurs to form a short and thick silver nanowire and a network is formed between the silver nanowires due to the abrupt growth to form clusters, which are a factor of production yield reduction.

Figure 4:
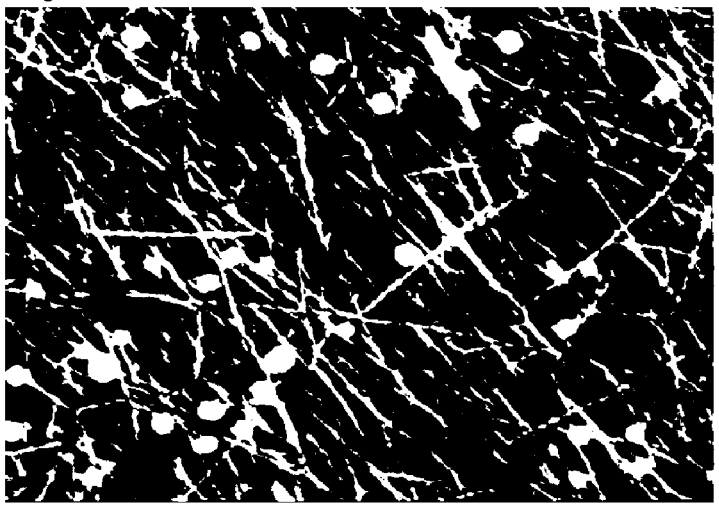
FIG. 4 is a photograph of a silver nanowire manufactured according to Comparative example 2.

From FIG. 4 which is the photograph of the silver nanowire according to Comparative example 2, it can be seen that materials generated by insoluble catalyst are positioned in a particle form between the nanowires. On the other hand, from FIG. 2 which is the photograph of the silver nanowire according to Embodiment 1, such a particle form is not observed. That is, it can be seen that insoluble catalyst can be easily removed by using a refining material capable of converting insoluble catalyst in embodiment 1 into a soluble material.

Hereinafter, a method for manufacturing a nanowire according to Embodiment 2 will be described with reference to FIG. 1. Description for Embodiment 2 will be given with reference to the description for the method for manufacturing nanowire according to previous Embodiment 1. The description for previous Embodiment 1 may be substantially coupled to the description for Embodiment 2, except for a changed portion.

Referring to FIG. 1, a method for manufacturing a nanowire according to Embodiment 1 includes forming (ST10-ST50) a metal nanowire, and refining (ST60) the metal nanowire. Herein, the forming (ST10-ST50) of the metal nanowire may include heating (ST10) a solvent, adding (ST20) a capping agent to the solvent, adding (ST30) a catalyst to the solvent, adding (ST40) a metal compound to the solvent, and additionally adding (ST50) a room temperature solvent to the solvent.

These steps are not essential but some of these steps may be not performed and sequence of these steps may be changed according to a manufacturing method. Each of the foregoing steps will now be described in more detail.

In the adding (ST30) of the catalyst to the solvent, bay salt or refined salt is added as the catalyst. The bay salt or refined salt contains various metal or halogen elements together with NaCl and functions as a seed for forming a metal nanowire and functions to accelerate reaction for forming a metal nanowire. Examples of the various metal or halogen elements may include Mg, K, Zn, Fe, Se, Mn, P, Br, I and the like.

As an example, bay salt may include 80 wt % to 90 wt % NaCl, 3 wt % to 12 wt % $H_2O$, 0.2 wt % to 1.2 wt % Mg, 0.05 wt % to 0.5 wt % K and 1 wt % to 8 wt % additional element. The additional element may, for example, include Zn, Fe, Se, Mn, P, Br, I and the like. It is preferable that the additional element should be contained by 4 wt % to 8 wt %.

As an example, refined salt may include 99 wt % or more NaCl, 0.2 wt % to 1.0 wt % $H_2O$, 0.02 wt % to 0.04 wt % Mg, 0.03 wt % to 0.08 wt % K, and 0.4 wt % or less additional element. The additional element may, for example, include Zn, Fe, Se, Mn, P, Br, I and the like. The additional element may be contained by 0.02 wt % to 0.4 wt %. Thus, although the amount of the additional element such as Mg, K, Br and the like in the refining salt is a little less than that in the bay salt, since the refining salt contains a predetermined percentage or more of the additional element, the refining salt may accelerate the formation of the metal nanowire.

Thus, in the present invention, since the bay salt or refining salt contains Mg, K, Zn, Fe, Se, Mn, P, Br, I and the like at a predetermined ratio together with NaCl, the bay salt or refining salt allows the reaction for forming a metal nanowire to be easily performed. In particular, Cl, Br and I which are halogen elements may act as a main factor in the formation of the nanowire. Also, Mg may act as a co-catalyst which is important in reducing a metal (e.g., silver) constituting a metal compound. The foregoing composition is limited such that the bay salt or refined salt may properly perform a role as the catalyst. described above, refining salt or bay salt may be added alone without separately adding the foregoing metal or halogen element, so that the manufacturing process may be simplified.

Next, in the adding (ST40) of the metal compound to the solvent, a metal compound is added to the solvent to form a reaction solution.

At this time, the metal compound may be added to the solvent containing capping agent and catalyst after the metal compound is dissolved by a separate solvent. The separate solvent may be the same material as or a different material from the solvent used primarily. The metal compound may be added after catalyst is added and a predetermined time period elapses. This is to stabilize the temperature to a proper reaction temperature.

Herein, the metal compound is a compound containing a metal for forming a metal nanowire intended to manufacture. In the case of forming a silver nanowire, a metal compound such as $AgNO_3$, $KAg(CN)_2$, or the like may be used.

When the metal compound is added to the solvent to which capping agent and catalyst have been added, a reaction occurs to start forming of a metal nanowire.

In this embodiment, the capping agent may be added by 50-30 parts by weight with respect to 100 parts by weight of a metal compound such as $AgNO_3$ or $KAg(CN)_2$. In the case where the capping agent is added less than 50 parts by weight, agglomeration phenomenon cannot be prevented sufficiently. In the case where the capping agent is added in excess of 300 parts by weight, spherical and/or polyhedral metal nano particles may be generated or the capping agent may be left in the manufactured metal nanowire to reduce the electrical conductivity.

The catalyst may be added by 0.005 parts by weight to 0.5 parts by weight with respect to 100 parts by weight of the metal compound. If the catalyst is added less than 0.005 parts by weight, the reaction cannot be accelerated sufficiently. If the catalyst is added in excess of 0.5 parts by weight, reduction of silver occurs abruptly, so that silver nano particles may be generated, the diameter of nanowire may be increased, the length of nanowire may be shortened, and catalyst may be left in the manufactured metal nanowire to reduce the electrical conductivity.

The metal nanowire manufactured as such may include Na, Mg, K, Zn, Fe, Se, Mn, P, Cl, Br, I and the like contained in the catalyst. Since various metals or halogen elements such as Na, Mg, Zn, K, Cl, Br and the like contained in the bay salt or refined salt allow metal nanowire to be formed with a thin and long form, the diameter of the metal nanowire may be in a range of 60 μm to 80 μm, and the length of the metal nanowire may be 20 μm or more.

Next, in the refining (ST60) of the nanowire, the metal nanowire is refined and collected from the reaction solution.

In more detail, by adding acetone or the like which is a more nonpolar solvent than water to the reaction solution, the metal nanowire is precipitated at a lower portion of the reaction solution by the capping agent left on a surface of the metal nanowire. This is why the capping agent is well dissolved in the solution but is not dissolved in acetone or the like but is precipitated. Thereafter, by throwing an upper layer solution away, some of the capping agent and the nano particles are removed.

When distilled water is added to the remaining solution, metal nanowire and metal nano particles are dispersed, and when acetone or the like is added additionally, the metal nanowire is precipitated and the metal nano particles are dispersed in the upper layer solution. Thereafter, by throwing the upper layer solution away, some of the capping agent and the metal nano particles formed by agglomeration are removed. This process is repeatedly performed to collect the metal nanowire, and the collected metal nanowire is stored in the distilled water. By storing the metal nanowire in the distilled water, it can be prevented that the metal nanowires are again agglomerated.

In the present invention, bay salt or refined salt is used as catalyst instead of catalyst such as halogen element, Pt, Pd, Fe, Cu, or the like. In the case where an excess amount of halogen element is used, a surface of the metal nanowire may be oxidized due to halogen ions left in the metal nanowire, or electrical conductivity may be reduced. If a precious metal such as Pt, Pd, or the like is used as catalyst, production cost may be raised, and if an inexpensive metal such as Fe, Cu, or the like is used as catalyst, metal nanowire may be corroded. The present invention can prevent all the limitations mentioned in the above, i.e., surface oxidation and corrosion can be prevented, electrical conductivity can be enhanced, and production cost can be saved.

Various metals or halogen elements such as Na, Mg, Zn, K, Cl, Br and the like contained in the bay salt or refined salt allow metal nanowire to be formed with a thin and long form, so that electrical conductivity, flexibility and transmittance of metal nanowire can be enhanced. Also, since metal nanowire can be smoothly formed by bay salt or refined salt, the amount of capping agent can be reduced and thus the electrical conductivity can be prevented from being reduced by the remaining capping agent.

Meanwhile, in this embodiment, by lowering the reaction temperature through use of a solvent having a strong reducing force and thus minimizing agglomeration phenomenon, production yield of the metal nanowire can be enhanced. As an example, 80% or more production yield can be obtained.

Hereinafter, the present invention will be described in more detail through embodiments . . . the embodiments are used only for illustration of the present invention, and the prevent invention is not limited to the embodiments.

Embodiment 2

200 ml propylene was heated to 126° C., 1.68 g polyvinyl pyrrolidone was added and dissolved, and 0.00058 g bay salt was added as catalyst. At this time, the bay salt contains 82.8 wt % NaCl, 9.8 wt % moisture ($H_2O$), 0.98 wt % Mg, and 0.31 wt % K together with Zn, Fe, Se, Mn, P, Br, and I. A total weight percent of Zn, Fe, Se, Mn, P, Br and I was 6.11 wt %. After 10 minutes, 1.78 g $AgNO_3$ was dissolved in 50 ml propylene glycol and then was added to a mixing solution of polyvinyl pyrrolidone, bay salt and solvent. After about 30 minutes, when silver nanowire started to be generated, 20 ml room temperature propylene glycol was added additionally. Thereafter, reaction continued for about 1 hour to complete the formation of silver nanowire.

500 ml acetone was added to the reaction-completed solution and then an upper layer solution in which propylene glycol and silver nano particles were dispersed was thrown away.

100 ml distilled water was added to disperse silver nanowire and silver nano particles which were agglomerated. 500 ml acetone was added and then an upper layer solution in which propylene glycol and silver nano particles were dispersed was thrown away. After this process was repeated three times, the remaining solution was stored in 10 ml distilled water.

Comparative Example 3

Except that reaction temperature was 160° C., 2.9 g polyvinyl pyrrolidone was added, 0.01 g NaCl (99.9%) was used as catalyst, a silver nanowire of comparative example 3 was manufactured in the same process as that of embodiment 2.

Comparative Example 4

Except that reaction temperature was 70° C., a silver nanowire of comparative example 4 was manufactured in the same process as that of embodiment 2

Figure 6:
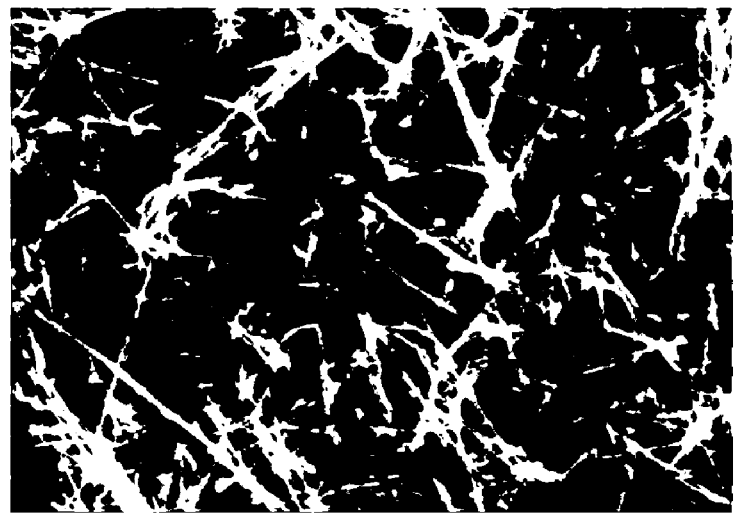
FIG. 6 is a photograph of a silver nanowire manufactured according to Comparative example 3.
Figure 7:
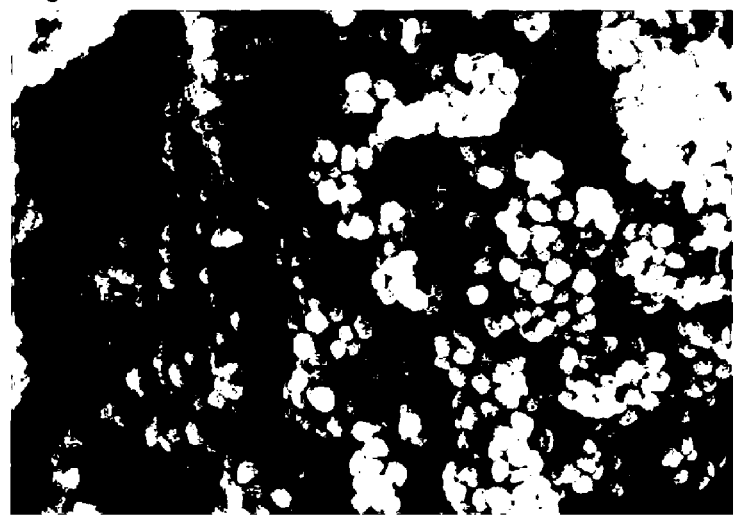
FIG. 7 is a photograph of a silver nanowire manufactured according to Comparative example 4.

Diameter, length, production yield, purity after refining, transmittance, haze and surface resistance of silver nanowires manufactured according to Embodiment 2, Comparative example 2, Comparative example 3 and Comparative example 4 are shown in table 2. Also, photographs of silver nanowires manufactured according to Embodiment 2, Comparative example 3, and Comparative example 3 were taken and shown in FIGS. 5, 6 and 7, respectively.

TABLE 2

| | Embodiment 2 | Comparative ex. 3 | Comparative ex. 4 |
|---|---|---|---|
| Diameter[nm] | 60~80 | 40~60 | Less than 500 |
| Length[μm] | 20 or more | Less than 5 | Less than 0.5 |
| Production yield[%] | 80 or more | Less than 20 | Less than 20 |
| Purity after refinement [%] | 99 or more | 95 or less | 10 or less |
| Transmittance[T %] | 87 or more | 85 or less | 85 or more |
| Haze[%] | 2.5 or less | 4.0 or more | 5.0 or less |
| Surface resistance [Ω/□] | 170 or less | 1000 or more | 10000 or more |

Figure 5:
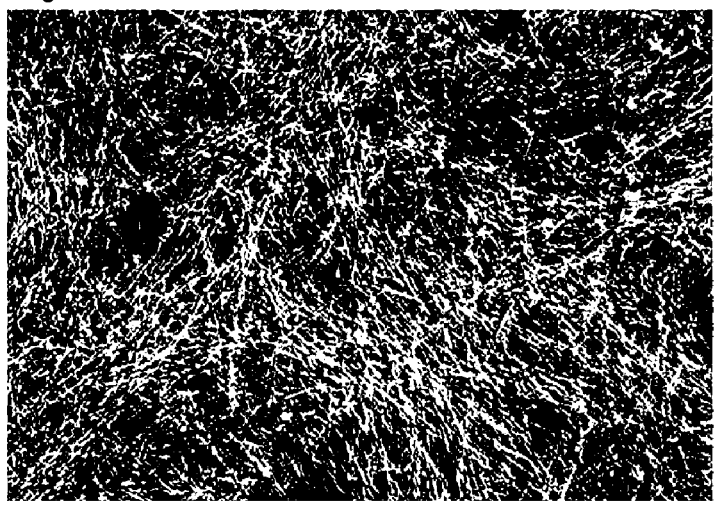
FIG. 5 is a photograph of a silver nanowire manufactured according to Embodiment 2.
Figure 5:
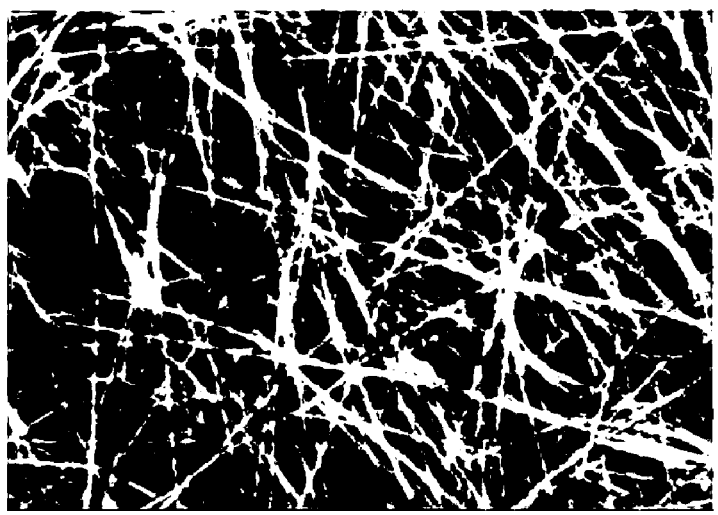

Referring to table 2 and FIG. 5, it can be seen that the silver nanowire according to Embodiment 2 has a length of 20 μm or more, and a production yield of 90% or more. On the other hand, referring to table 2 and FIGS. 6 and 7, it can be seen that the silver nanowire according to Comparative example 3 has a length of less than 5 μm and a production yield of less than 20%. In the case of Comparative example 4, silver nanowire was not generated but nano particles were generated. That is, compared with the silver nanowires of Comparative examples 3 and 4, the silver nanowire of Embodiment 2 is long and may be manufactured with a superior production yield.

As described above, 1.68 g Polyvinyl pyrrolidone was used in Embodiment 2 and 2.9 g polyvinyl pyrrolidone was used in Comparative examples 3 and 4. Thus, it can be seen that while the amount of capping agent was decreased in Embodiment 2, the length of nanowire was increased and production yield was also enhanced. By decreasing the amount of capping agent, characteristics of manufactured silver nanowire such as electrical conductivity and the like can be enhanced.

Also, 0.00058 g catalyst (bay salt) was used in Embodiment 2 and 0.001 g catalyst (NaCl, 99.9%) was used in Comparative examples 5 and 6. Thus, it can be seen that while the amount of catalyst was decreased in Embodiment 2, characteristics of silver nanowire and production yield were enhanced.

Features, structures, and effects described in the above embodiments are incorporated into at least one embodiment of the present invention, but are not limited to only one embodiment. Moreover, features, structures, and effects exemplified in one embodiment can easily be combined and modified for another embodiment by those skilled in the art. Therefore, these combinations and modifications should be construed as falling within the scope of the present invention.

Further, while the present invention has been particularly shown and described with reference to exemplary embodiments thereof, it will be understood by those of ordinary skill in the art that the exemplary embodiments are used only for illustration and various changes in form and details may be made therein without departing from the substantial features of the embodiments. For example, each element specifically appearing in the embodiment may be carried out through a modification. All differences related in the modification and application thereof will be construed as being included within the scope of the invention as defined by the following claims.

The invention claimed is:

1. A method for manufacturing a nanowire, the method comprising:
   heating a solvent;
   adding a catalyst to the solvent;
   adding a metal compound to the solvent to form a metal nanowire; and
   refining the metal nanowire by adding a refining material to the solvent to convert an insoluble material generated by the catalyst into a soluble material,
   wherein the refining material comprises at least one selected from the group consisting of KCN and NaCN, and
   wherein a molar ratio of the refining material to the catalyst (moles of refining material/moles of catalyst) is 1.5 to 3.

2. The method of claim 1, wherein the catalyst comprises at least one selected from the group consisting of AgCl, KBr, KI, $CuCl_2$, $PtCl_2$, $H_2PtCl_4$, $H_2PtCl_6$, AuCl, $AuCl_3$, $HAuCl_4$ and $HAuCl_2$.

3. The method of claim 1, wherein the refining material is added to the solvent in a state that the refining material is dissolved in distilled water.

4. The method of claim 1, wherein the metal nanowire comprises silver (Ag).

5. The method of claim 1, wherein the solvent comprises at least one selected from the group consisting of propylene glycol (PG), 1,3-propanediol, and dipropylene glycol, and in the heating of the solvent, the solvent is heated to a temperature ranging from 80° C. to 140° C.

6. The method of claim 1, wherein the metal nanowire has a length of 20 μm or more.

7. The method of claim 1, wherein the catalyst comprises NaCl and at least one selected from the group consisting of Mg, K, Zn, Fe, Se, Mn, P, Br, and I.

8. The method of claim 7, wherein the catalyst comprises at least one of bay salt and refined salt.

9. The method of claim 7, wherein a ratio by weight of the catalyst to the metal compound is in a range of 0.005:100 to 0.5:100.

10. The method of claim 1, wherein the catalyst comprises 80 wt % to 90 wt % NaCl, 3 wt % to 12 wt % $H_2O$, 0.2 wt % to 1.2 wt % Mg, 0.05 wt % to 0.5 wt % K, and 1 wt % to 8 wt % of an additional component; and wherein the additional component comprises at least one selected from the group consisting of Zn, Fe, Se, Mn, P, Br, and I.

11. The method of claim 1, further comprising:
   after the heating of the solvent, adding a capping agent to the solvent; and
   after the adding of the metal compound to the solvent, adding a room temperature solvent to the solvent.

12. The method of claim 11, wherein the capping agent is contained by 50 parts by weight to 300 parts by weight with respect to 100 parts by weight of the metal compound.

* * * * *